(12) United States Patent
Bhattacharya

(10) Patent No.: US 9,410,259 B2
(45) Date of Patent: Aug. 9, 2016

(54) ELECTRODEPOSITION OF GALLIUM FOR PHOTOVOLTAICS

(75) Inventor: Raghu N. Bhattacharya, Littleton, CO (US)

(73) Assignee: Alliance for Sustainable Energy, LLC, Golden, CO (US)

(*) Notice: Subject to any disclaimer, the term of this patent is extended or adjusted under 35 U.S.C. 154(b) by 267 days.

(21) Appl. No.: 14/240,679

(22) PCT Filed: Sep. 4, 2012

(86) PCT No.: PCT/US2012/053709
§ 371 (c)(1),
(2), (4) Date: Feb. 24, 2014

(87) PCT Pub. No.: WO2013/033729
PCT Pub. Date: Mar. 7, 2013

(65) Prior Publication Data
US 2014/0202870 A1    Jul. 24, 2014

Related U.S. Application Data

(60) Provisional application No. 61/530,738, filed on Sep. 2, 2011.

(51) Int. Cl.
*C25D 7/12*  (2006.01)
*C25D 11/32* (2006.01)
*C25D 5/54*  (2006.01)
*C25D 7/10*  (2006.01)
(Continued)

(52) U.S. Cl.
CPC .. *C25D 3/54* (2013.01); *C25D 5/10* (2013.01); *C25D 5/50* (2013.01); *C25D 5/54* (2013.01); *H01L 31/0322* (2013.01); *H01L 31/0747* (2013.01); *C25D 7/126* (2013.01); *Y02E 10/541* (2013.01); *Y02P 70/521* (2015.11)

(58) Field of Classification Search
CPC .............. C25D 3/54; C25D 5/50; C25D 3/02; C25D 5/10; C25D 7/12
USPC ......... 205/224, 227, 261, 157, 159, 162, 170, 205/182
See application file for complete search history.

(56) References Cited

U.S. PATENT DOCUMENTS 6,063,172 A    5/2000  Bokisa et al.
7,507,321 B2   3/2009  Aksu et al.
(Continued)

FOREIGN PATENT DOCUMENTS

WO    2009032021    3/2009
WO    2009061984    5/2009
(Continued)

OTHER PUBLICATIONS

Steichen et al., "Controlled Electrodeposition of Cu—Ga from a Deep Eutectic Solvent for Low Cost Fabrication of CuGaSe2 Thin Film Solar Cells," Phys. Chem. Chem. Phys. (no month, 2011), vol. 13, pp. 4292-4302.*

(Continued)

*Primary Examiner* — Edna Wong
(74) *Attorney, Agent, or Firm* — Suzanne C. Walts

(57) ABSTRACT

An electroplating solution and method for producing an electroplating solution containing a gallium salt, an ionic compound and a solvent that results in a gallium thin film that can be deposited on a substrate.

16 Claims, 7 Drawing Sheets

(51) Int. Cl.

| | |
|---|---|
| *C25D 5/10* | (2006.01) |
| *C25D 5/50* | (2006.01) |
| *C25D 3/00* | (2006.01) |
| *C25D 3/54* | (2006.01) |
| *H01L 31/032* | (2006.01) |
| *H01L 31/0747* | (2012.01) |

(56) References Cited

U.S. PATENT DOCUMENTS

| | | |
|---|---|---|
| 7,892,413 B2 | 2/2011 | Aksu et al. |
| 7,951,280 B2 | 5/2011 | Wang et al. |
| 2004/0206390 A1* | 10/2004 | Bhattacharya ...... H01L 31/0322 136/262 |
| 2005/0173255 A1 | 8/2005 | Bokisa et al. |
| 2010/0059385 A1 | 3/2010 | Li |
| 2010/0116678 A1 | 5/2010 | Wang et al. |
| 2010/0329967 A1* | 12/2010 | Lu ..................... C01B 19/002 423/508 |
| 2011/0108115 A1 | 5/2011 | Deligianni et al. |
| 2012/0055612 A1 | 3/2012 | Ahmed et al. |
| 2012/0055801 A1* | 3/2012 | Ahmed ................ C25D 3/56 205/158 |

FOREIGN PATENT DOCUMENTS

| | | |
|---|---|---|
| WO | 2011029197 | 3/2011 |
| WO | 2011075561 | 6/2011 |
| WO | 2012028415 | 3/2012 |
| WO | 2012028416 | 3/2012 |

OTHER PUBLICATIONS

Kapur et al., "Low Cost Methods for the Production of Semiconductor Films for CuInSe2/CdS Solar Cells," Solar Cells (no month, 1987), vol. 21, pp. 65-72.*

Bhattacharya et al., "CIGS-based solar cells prepared from electrodeposited precursor films", NREL Highlights Science, http://www.nrel.gov/science_technology/pdfs/51752.pdf, accessed Aug. 16, 2012, p. 1.

Bhattacharya et al., "CIGS-Based Solar Cells Prepared from Electrodeposited Precursor Films", International Union of Materials Research Societies—International Conference in Asia 2012, Aug. 26-31, 2012, Busan, Korea, http://www.iumrs-ica2012.org/download/program/MoA1.pdf, p. 1.

Bhattacharya et al., "CIGS-based solar cells prepared from electrodeposited precursor films", Solar Energy Materials and Solar Cells, Mar. 2012, vol. 98, pp. 198-202.

International Search Report and Written Opinion for PCT Application No. PCT/US2012/053709, mailed on Nov. 5, 2012, pp. 1-8.

* cited by examiner

FIGURE 3
FIGURE 3A
(SEM of surface)
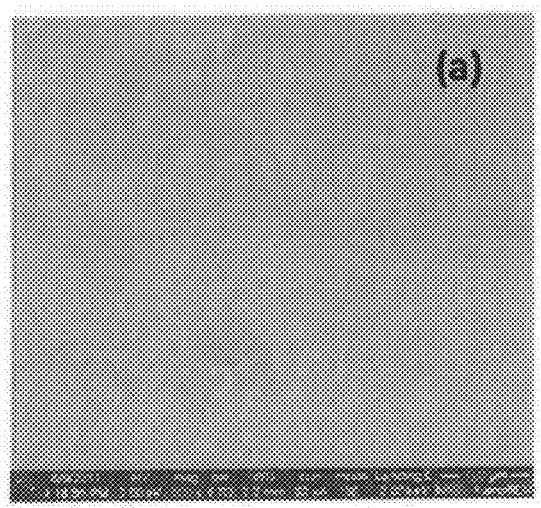
FIGURE 3B
(SEM Cross-section)
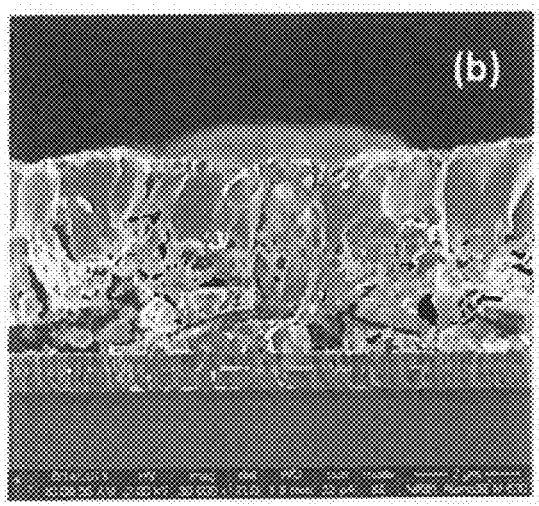

Current voltage characteristics of a CIGS solar cell: $V_{oc} = 0.46$ V; $J_{sc} = 37$ mA/cm$^2$; fill factor = 64; Efficiency = 11.08%

$V_{oc}$=0.4751 V
$I_{sc}$ = 15.996 mA
$J_{sc}$ = 37.482 mA/cm$^2$
Fill Factor = 65.76%

Storage state $I_{max}$=14.044 mA
$V_{max}$= 0.3559 V
$P_{max}$= 49979 mW

Efficiency = 11.71%

ELECTRODEPOSITION OF GALLIUM FOR PHOTOVOLTAICS

CROSS-REFERENCE TO RELATED APPLICATIONS

This application claims the benefit of U.S. Provisional Application No. 61/530,738, filed Sep. 2, 2011, the contents of which are incorporated by reference in their entirety.

CONTRACTUAL ORIGIN

The United States Government has rights in this invention under Contract No. DE-AC36-08GO28308 between the United States Department of Energy and the Alliance for Sustainable Energy, LLC, the Manager and Operator of the National Renewable Energy Laboratory.

BACKGROUND

Solar cells are a very attractive source of clean energy. $CuIn_{1-x}Ga_xSe_2$ (CIGS) has the potential to become a major candidate in this field. Its large optical absorption coefficient, which results from a direct energy gap, permits the use of thin layers (1-2 μm) of active material. CIGS solar cells are also known for their long-term stability. Currently, a great deal of effort is being expended to develop low-cost technologies for fabricating CIGS thin films, using several techniques, including vacuum deposition technology such as physical vapor deposition and sputtering, and non-vacuum technologies such as electrodeposition, nano-particles-based deposition, ink jet printing and electroless deposition. Physical vapor deposition (PVD) is an excellent tool for understanding film growth and for developing models, but it is challenging to scale up for commercial production because of film non-uniformity and low material utilization. Sputtering techniques are suitable for large-area deposition, but they require expensive vacuum equipment and sputtering targets.

A non-vacuum electrodeposition technique has the potential to prepare large-area uniform precursor films using low-cost source materials and low-cost capital equipment. Electroplating is a potentially suitable preparation method to obtain low-cost precursor films. The electrodeposition process could provide: (a) high-quality film with very low capital investment; (b) a low-cost, high-rate process; (c) use of very low-cost starting materials (e.g., low-purity salts, solvents), based on automatic purification of the deposited materials during plating; (d) a large-area, continuous, multi-component, low-temperature deposition method; (e) deposition of films on a variety of shapes and forms (wires, tapes, coils, and cylinders); (f) controlled deposition rates and effective material use (as high as 98%); and (g) minimum waste generation (i.e., solution can be recycled). Therefore, the electrodeposition technique has been attractive for growing CIGS layers for photovoltaic applications. It is of general interest in this field to obtain high-efficiency electrodeposited CIGS solar cell devices without requiring the use of any PVD step.

The foregoing examples of the related art and limitations related therewith are intended to be illustrative and not exclusive. Other limitations of the related art will become apparent to those of skill in the art upon a reading of the specification and a study of the drawings.

SUMMARY

The following embodiments and aspects thereof are described and illustrated in conjunction with systems, tools and methods that are meant to be exemplary and illustrative, not limiting in scope. In various embodiments, one or more of the above-described problems have been reduced or eliminated, while other embodiments are directed to other improvements.

CIGS-based solar cells formed directly from electrodeposited precursor films with high efficiencies are provided, in which the expensive PVD step is eliminated. Exemplary electodeposited CIGS absorber layers are fabricated from a stacked Cu/In/Ga layers. These exemplary films are electrodeposited from an aqueous-based electroplating solution. Exemplary embodiments provide for an electroplating solution comprised of a gallium salt, an ionic compound and a solvent. The gallium salt can be gallium chloride, gallium nitrate, gallium sulfate, gallium acetate, gallium fluoride, gallium chloride, gallium bromide, gallium iodide or any source of gallium. In some embodiments, the ionic compounds can be inorganic salts or any supporting electrolyte or complexing ion, such as sodium fluoride, potassium fluoride, potassium bifluoride, sodium bifluoride, sodium chloride, potassium chloride and combinations thereof. In other embodiments, organic salts or ionic liquids may be used. In certain embodiments, the electroplating solution has a pH range of 1-3, or in some cases, it can be in the pH range of 1 to 12. In some embodiments, the solvent is water. In other embodiments, the solvent comprises the organic salt mixed with ethylene glycol, imidazolium-, phosphonium-, pyridinium-, pyrrolidinium-, sulfonium-or urea. Additional embodiments provide for an atomic percent of gallium in the range of 0.5-30%. Further provided are methods for producing a thin film by electrodepositing the thin film on a substrate from an electroplating solution containing a gallium salt, an ionic compound, and a solvent. In other embodiments, an annealing step is included.

In addition to the exemplary aspects and embodiments described above, further aspects and embodiments will become apparent by reference to the drawings and by study of the following descriptions.

BRIEF DESCRIPTION OF THE DRAWINGS

Exemplary embodiments are illustrated in referenced figures of the drawings. It is intended that the embodiments and figures disclosed herein are to be considered illustrative rather than limiting.

FIGS. 3a and 3b show the surface morphology and cross-sectional view using scanning electron microscopy (SEM).

DETAILED DESCRIPTION

Figure 1:
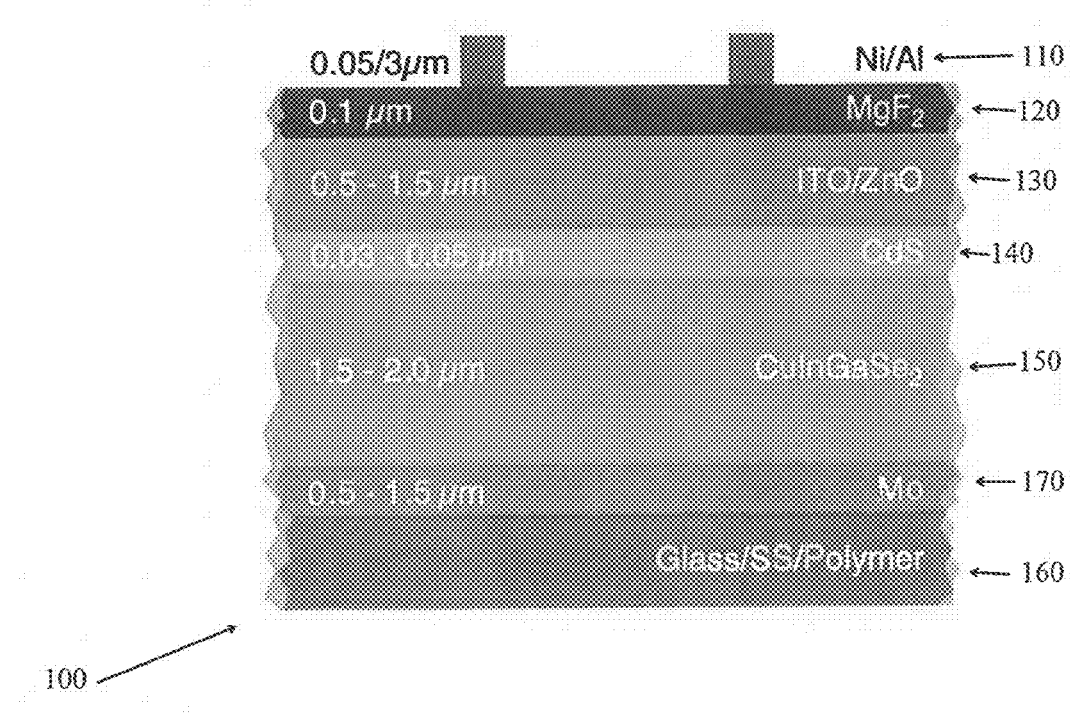
FIG. 1 illustrates a completed exemplary device structure.

CIGS-based solar cells formed directly from electrodeposited precursor films with high efficiencies are provided, in which the expensive PVD step is eliminated. Exemplary electodeposited CIGS absorber layers are fabricated from a stacked Cu/In/Ga layers. These exemplary films are electrodeposited from an aqueous-based electroplating solution.

Disclosed herein are gallium salts to be used in an electroplating solution. Although $GaCl_3$ has been used in the below examples, it is possible to utilize any source of gallium such as the following trihalides: gallium(III) fluoride, gallium(III) chloride, gallium(III) bromide and gallium(III) iodide. Additional examples of gallium salts may also be gallium nitrate, gallium sulfate and gallium acetate. Suitable ionic compounds or supporting electrolyte/complexing ions are inorganic salts such as sodium fluoride, potassium fluoride, potassium bifluoride, sodium bifluoride, sodium chloride, or potassium chloride. Organic salts such as ethanol, methanol, isopropanol, dimethyl sulfoxide, triethanollamine may be used. Ionic liquids such as, choline chloride, ammonium-, imidazolium-, phosphonium-, pyridinium-, pyrrolidinium-, or sulfonium-based liquids may also be used.

Exemplary solvents for dissolving the ionic compounds or supporting electrolyte/complexing ions are provided in the examples, such as water or choline chloride mixed with ethylene glycol or urea, but any solvent that dissolves an ionic compound may be used. Various types of substrates may be used, such as glass, molybdenum, silicon, silicon dioxide, aluminum oxide, sapphire, germanium, gallium arsenide (GaAs), an alloy of silicon and germanium, indium phosphide (InP) or any combination thereof.

Exemplary methods for electrodepositing thin films are provided in the examples, but any method suitable for moving metal ions in a solution by an electric field to coat an electrode may be used. An exemplary embodiment may involve films electrodeposited by applying direct-current (dc) voltage. Further embodiments of precursor films may be prepared by employing a two-electrode cell in which the counter electrode can be platinum (Pt) gauze and the working electrode (substrate) can be glass/molybdenum (Mo). In other embodiments, there can be three-electrode cells comprising of a working, counter and reference electrodes.

In another exemplary embodiment, the method also includes an annealing step wherein the exemplary embodiment described above is concluded by annealing the three-layers of electrodeposited films to the substrate surface. The metallic stacked layers are annealed at high temperature to obtain active CIGS absorber layers. Both the time and temperature of the annealing step can be altered. In some embodiments, annealing can occur for a period of time ranging from about 10 minutes to about 120 minutes. In some embodiments, the annealing can occur at a temperature ranging from about 100° C. to about 600° C. In some embodiments, the annealing can occur in $H_2S$ and $H_2Se$. In other embodiments, the annealing can occur in an atomsphere of Se, S, or any combination therof.

An exemplary annealing temperature profile consists of starting at 25-30° C.; increase the temperature to 300-400° C. in 10-20 minutes at a Se evaporation rate of 10-20 Å/S, anneal at 400° C. for 10-30 minutes, increase the sample temperature to 550° C. in 10-40 minutes at a Se evaporation rate of 15-30 Å/S, anneal at 550° C. for 30-55 minutes, or any combination therof.

As shown in FIG. 1, an exemplary seven layer CIGS device 100 is shown. The first layer is the substrate 160. The second layer 170 is a Molybdenum coating. CIGS makes up the third layer 150. The fourth layer 140 is sulfur based (CdS, CdZnS, ZnS or InS), followed by an intrinsic and conducting layer 130 (ZnO or indium titanium oxide [ITO]). The sixth layer 120 includes antireflecting coatings, followed by top contacts 110. In this design, the layers of the device are deposited onto a substrate 160 (glass, stainless steel or polymer based). The CIGS layer 150 is deposited onto the Molybdenum coated second layer 170. A CdS layer 140 is deposited onto the CIGS layer 150, followed by an intrinsic and conducting layer of ZnO 130. A $MgF_2$ antireflection coating layer 120 is deposited, followed by bilayer Ni/Al top contacts 110. In some embodiments, the CIGS layer (150) has a thickness range between 0.5-6.0 μm, or at least between 0.5-2.0 μm.

Exemplary methods include the steps of a chemical-bath deposition of about 50 nm CdS (140), followed by RF sputtering of about 50 nm of intrinsic ZnO and of about 350 nm of $Al_2O_3$-doped conducting ZnO (130) onto the CIGS layer 150. Bilayer Ni/Al top contacts (110) can be deposited in an e-beam system. The final step in the fabrication sequence includes the deposition of an antireflection coating of about 100 nm of $MgF_2$ (120). Other types of antireflection coatings that may be used include thin film and nanocoatings of silicon monoxide (SiO).

Figure 2:
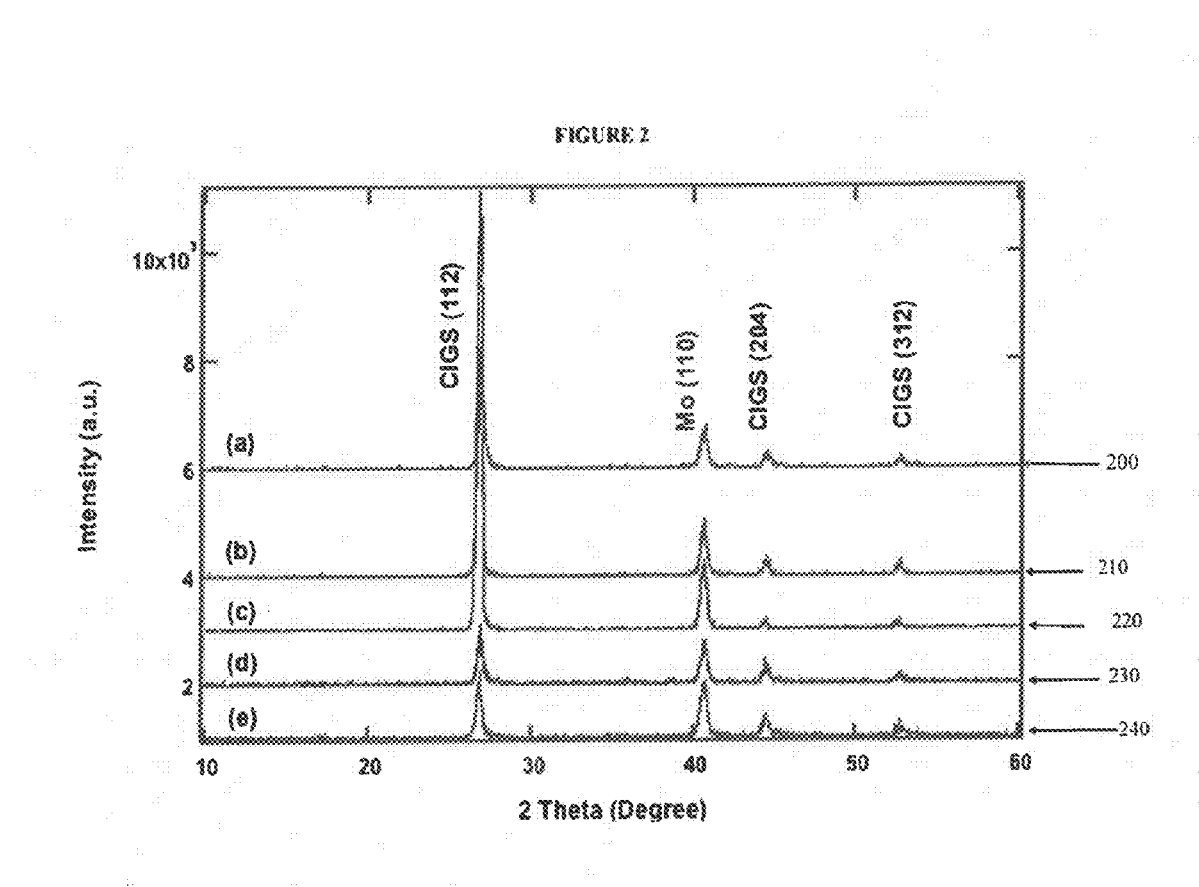
FIG. 2 illustrates X-ray diffraction analyses for the annealed stacked layers in selenium (Se)-vapor.

In one embodiment, electrodeposited Cu/In/Ga layers are fabricated by a three-step electrodeposition process in which: (a) Cu is electrodeposited in the first step on glass/Mo substrate, (b) In is electrodeposited in the second step, and (c) a Ga layer is deposited in the final third step. The films were annealed in Se atmosphere at 550° C. for 45 min. FIG. 2 shows the X-ray diffraction analysis results obtained from the annealed three-layers electrodeposited films. The compositions of stacked as-deposited precursor layers are given in Table 1.

The compositions of the films are analyzed by X-ray fluorescence (XRF) spectroscopy and ICP-MS. The following compositions are for some examples that are obtained from the as deposited metallic stack layer.

TABLE 1

| FIG. 2 | Cu (atom %) | In (atom %) | Ga (atom %) | Thickness (micron) |
|---|---|---|---|---|
| 200 | 41.9 | 60.6 | 0.1 | 1.04 |
| 210 | 41.9 | 58.0 | 0.2 | 1.01 |
| 220 | 40.6 | 48.6 | 10.7 | 0.98 |
| 230 | 40.0 | 47.0 | 12.7 | 1.15 |
| 240 | 39.6 | 49.6 | 10.8 | 1.01 |
|  | 45.5 | 42.9 | 11.5 | 0.95 |
|  | 40.5 | 33.0 | 26.0 | 1.07 |
|  | 40.0 | 38.0 | 21.0 | 1.01 |
| ChCl ionic liquid solvent | 41.3 | 51.5 | 7.2 | 0.97 |
| ChCl ionic liquid solvent | 37.0 | 52.0 | 10.5 | 1.03 |

Figure 5:
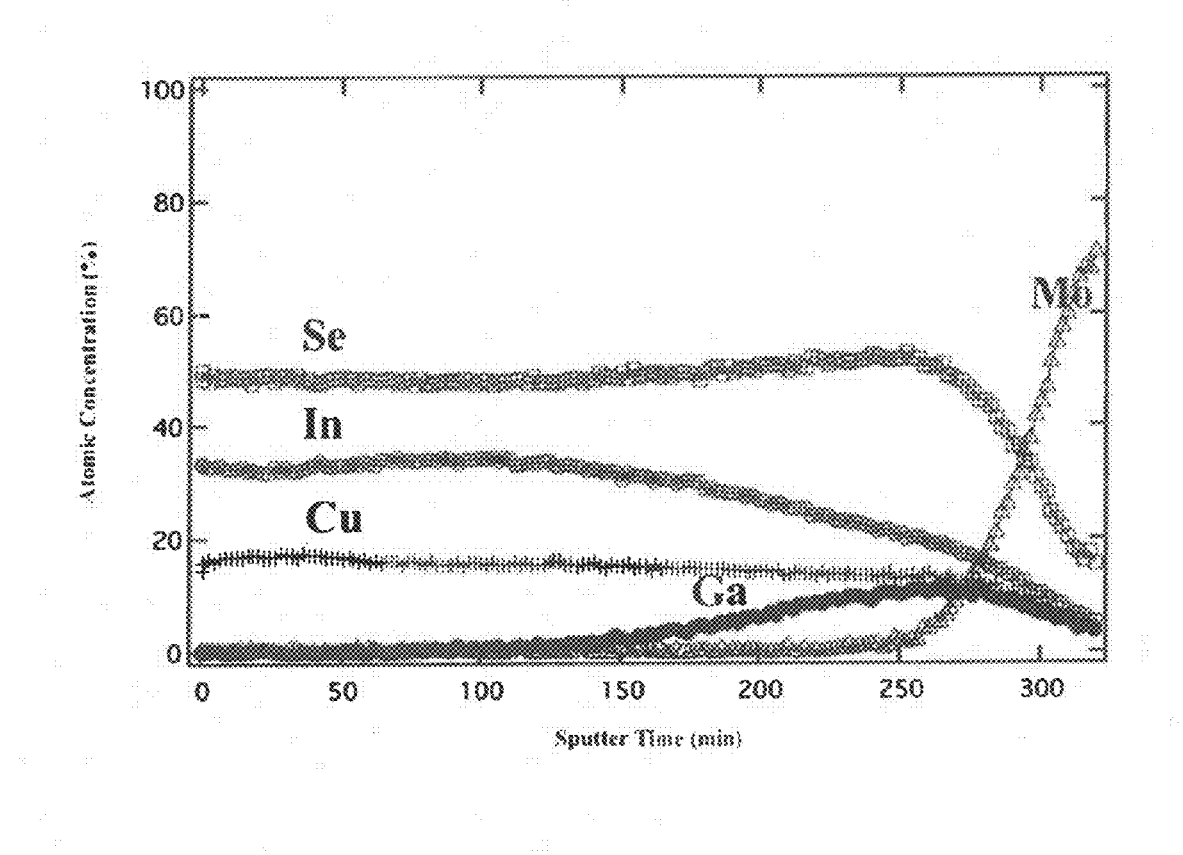
FIG. 5 shows the Auger analysis data of the annealed (absorber film) electrodeposited Cu/In/Ga stacked layer.

As shown in FIG. 2, all films show a similar phase development with different crystallinity after processing. The degree of crystallinity could be related to the as-deposited film composition and morphology, which was not co-related at present. The composition of the film annealed at 550° C. for 45 minutes in Se atmosphere was analyzed using an Auger electron spectroscopy (AES) depth profile. FIG. 5 shows the Auger analysis data of the annealed (absorber film) electrodeposited Cu/In/Ga stacked layer. The profile (FIG. 5) of the absorber material processed from the precursor film d, shows a very low concentration of Ga at the front, residing almost all Ga at the back. AES analysis data does not show any oxygen impurity in the film. The final processed absorber has low Ga content due to loss of material during annealing step.

The surface morphology and cross-sectional view [using scanning electron microscopy (SEM)] of the film annealed at 550° C. for 45 minutes are shown in FIGS. 3a and 3b. The SEM, as shown in FIG. 3a, indicates that the film is crack-free and has a compact dense morphology. The cross-sectional view (FIG. 3b) of the film shows the formation of voids and incomplete integrations between the layers, which is probably caused by the loss of materials.

Figure 4A:
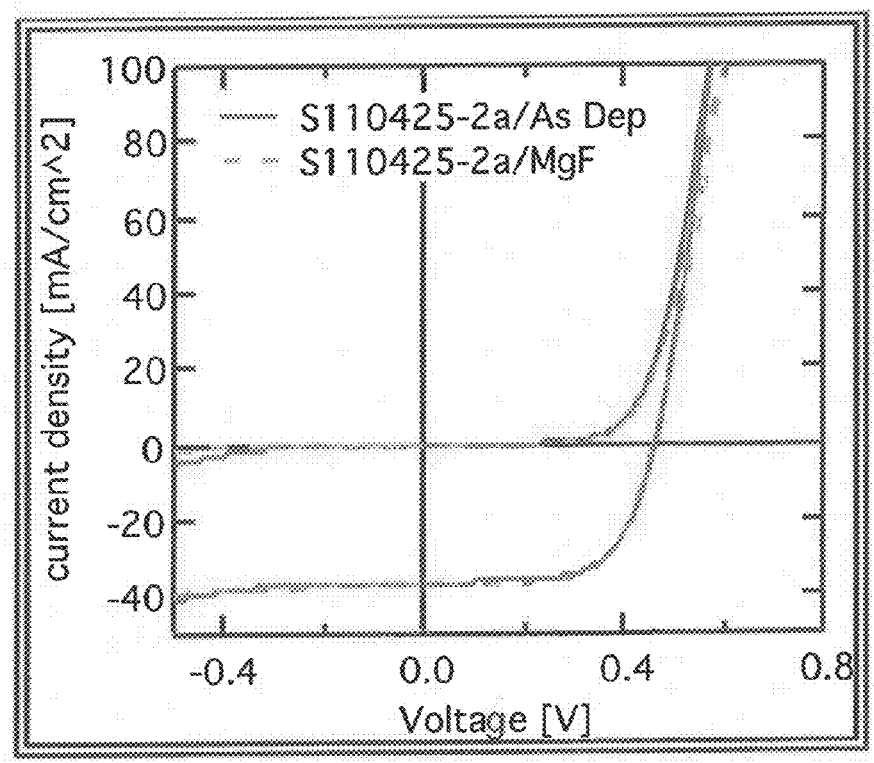
FIGS. 4a-4c show the quantum efficiency and current-voltage (I-V) characteristics of the device of varying efficiencies.
Figure 4B:
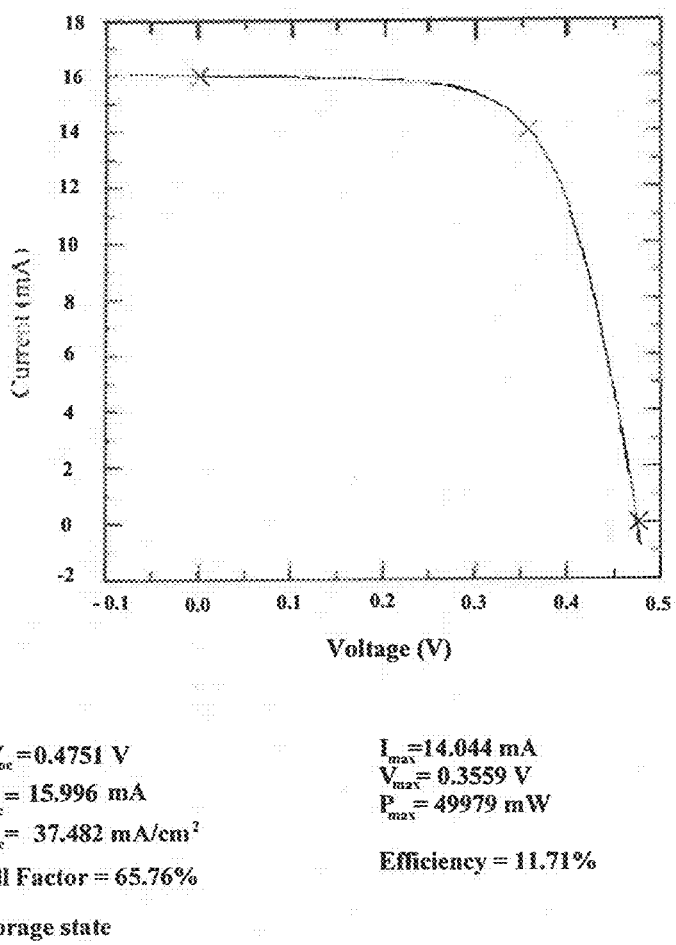
Figure 4C:
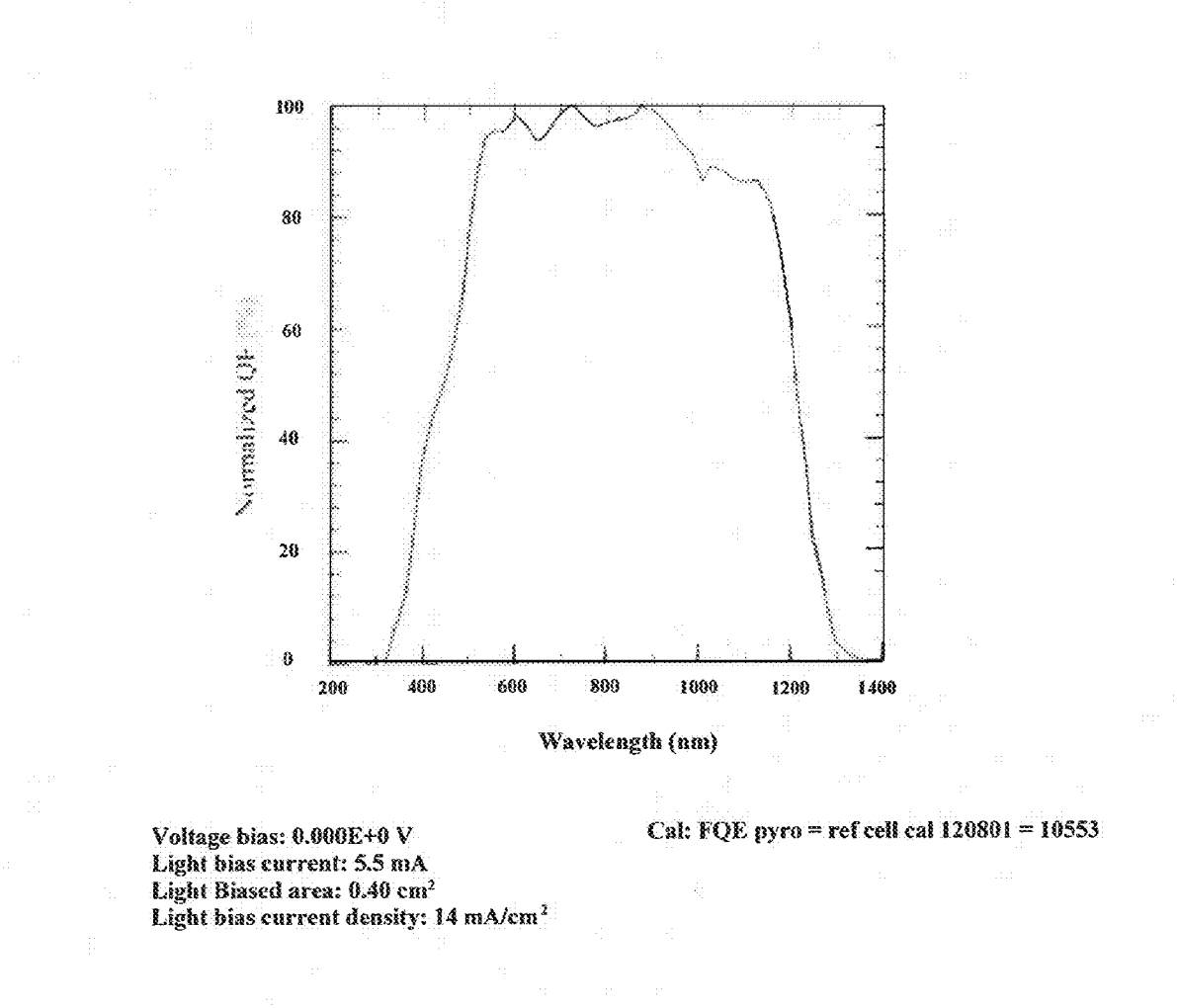

Improving the device efficiencies by optimizing the processing conditions to obtain void free absorber layer where the materials loss will be minimized and the integrations between the layers will be complete, is expected. The device efficiency of 11.7%-efficient device (FIG. 4b) was measured by the Cell Performance Characterization Group at NREL (official measurements). I-V characterization was carried out at AM1.5 illumination (1000 W/m$^2$, 25° C., ASTM G173 global). FIGS. 4a-4c show the quantum efficiency and current-voltage (I-V) characteristics of the device of varying efficiencies. FIG. 4a shows the current-voltage (J-V) of the 11.08%-efficient solar cell devices that were fabricated from absorber materials. The cell parameters are 0.46 V open-circuit voltage, 37 mA/cm$^2$ short-circuit current density, 64% fill factor, and 11.08% efficiency. FIG. 4b shows the current-voltage (J-V) of the 11.7%-efficient solar cell devices that were fabricated from absorber materials. The cell parameters are 0.48 V open-circuit voltage, 37.5 mA/cm$^2$ short-circuit current density, 66% fill factor, and 11.7% efficiency. FIG. 4c illustrates the QE characteristics of the 11.7%-efficient device. The QE measurement of the device indicates the bandgap of the material is—1.0 eV.

EXAMPLES

The following examples describe in detail certain properties of embodiments of the methods disclosed herein. It will be apparent to those skilled in the art that many modifications, both to materials and methods, may be practiced without departing from the scope of the disclosure. The following materials and methods were used in subsequent examples detailed below.

Electrodeposited films were prepared on glass coated Mo thin films. All films were electrodeposited by applying direct-current (dc) voltage and the solution was not stirred during deposition. The solution was not deaerated before or during deposition. The films were electrodeposited in a vertical cell in which the electrodes (both working and counter) were suspended vertically from the top of the cell. Precursor films were prepared by employing a two-electrode cell at constant current mode in which the counter electrode was Pt gauze and the working electrode (substrate) was glass/Mo. The Mo film was about 1 μm thick and was deposited by dc sputtering. The constant current mode using two electrode systems is more suitable for large area electrodeposition process compared with the three-electrode system, and is commonly practiced by the electroplating industries. A Fisher Scientific (FB300) power supply was used to electrodeposit Cu, In and Ga thin films. The dimension of working electrode glass/Mo was 64 cm$^2$ and the dimension of counter electrode Pt gauze was 10 cm$^2$. Molybdenum films are sputtered deposited on glass substrates. The Mo film was about 0.5 to 1 μm thick and was deposited by dc sputtering. The structures of the electrodeposited layers are:
1. Glass/Mo/ED-Cu/ED-In/ED-Ga
2. Glass/Mo/ED-Cu/ED-In/ED-Ga/ED-In
3. Glass/Mo/ED-Cu/ED-Ga/ED-In
4. Glass/Mo/ED-Cu/ED-Ga/ED-In/ED-Ga
[ED: Electrodeposited]

For the complete CIGS layers, an exemplary embodiment of a copper thin film is electrodeposited from a solution containing 0.01M to 1M CuSO$_4$.5H$_2$O, 0.01M to 1M Na$_2$SO$_4$ and 0.01M to 1M H$_2$SO$_4$ dissolved in water, with a resulting pH in the range of 1 to 4. The copper films are electrodeposited at a plating current density of 1 to 10 mA/cm$^2$ for 1 to 10 minutes. Another exemplary embodiment uses an indium thin film electrodeposited from 0.01M to 2M InCl$_3$.4H$_2$O, 0.01M to 1M NaCl dissolved in water, with a resulting pH in the range of 1 to 3. The indium films are electrodeposited at a plating current density of 0.5 to 8 mA/cm$^2$ for 1 to 15 minutes.

In one embodiment, a copper thin film is electrodeposited from a solution containing 0.1M CuSO$_4$.5H$_2$O, 0.1M Na$_2$SO$_4$ and 0.1M H$_2$SO$_4$ dissolved in water. pH of the solution is approximately 1.6. The copper films are electrodeposited at a plating current density of 4 mA/cm$^2$ for 3 minutes. In another embodiment, an indium thin film is electrodeposited from 0.2M InCl$_3$.4H$_2$O, 0.1M NaCl dissolved in water. pH of the solution is approximately 2.4. The indium films are electrodeposited at a plating current density of 3.8 mA/cm$^2$ for 4 minutes.

In another embodiment, the copper layer was electrodeposited on glass/Mo substrate at room temperature from a 0.1M copper sulfate based solution using a constant current density of 8.2 mA/cm$^2$ for 3 minutes. In another embodiment, the indium layer was electrodeposited from a 0.1 M indium chloride based solution using a constant current density of 7.2 mA/cm$^2$ for 4 minutes.

Exemplary electrodeposited gallium thin film layers can be used. In some embodiments, a gallium chloride based solution was used. In other embodiments, gallium thin films were electrodeposited from a choline chloride and ethylene glycol solution mixture. In further embodiments, the atomic percentage of gallium varied. In certain embodiments, the atomic percentage was in the range between 0.5-30%.

Example 1

Gallium thin film is electrodeposited from 0.01M to 6M GaCl$_3$, 0.01M to 2M NaF and 0.01M to 5M NaCl dissolved in water. pH of the solution in the range of 1 to 3. The gallium films are electrodeposited at a plating current density of 0.1 to 5 mA/cm$^2$ for 1 to 30 minutes.

Example 2

Gallium thin film is electrodeposited from 0.64M GaCl$_3$, 1.43M NaF and 0.5M NaCl dissolved water. pH of the solution is approximately 1.73. The gallium films are electrodeposited at a plating current density of 0.8 mA/cm$^2$ for 7 minutes.

Example 3

The third Ga layer was electrodeposited from a 0.5 M gallium chloride based solution using a constant current density of 2 mA/cm$^2$ for 7 minutes.

Example 4

To prepare the choline chloride (ChCl)-based ionic liquid solvent, choline chloride powders were mixed with ethylene glycol with a molar ratio of 1:2, and then heated to 90° C. After the solution becomes transparent, it was further heated under vacuum for 1 h. The electroplating solution is prepared by dissolving 0.05M solutions of Ga(NO$_3$)$_3$ in 1 liter choline chloride ionic liquid solvent.

Example 5

Gallium thin film is electrodeposited from 0.05 M to 6M Ga(NO$_3$)$_3$ dissolved in choline chloride ionic liquid. The gallium films are electrodeposited at a plating current density of 0.5 to 10 mA/cm$^2$ for 1 to 30 minutes at solution temperature of 65° C. to 150° C.

Example 6

11.5 atom % Ga is electrodeposited from 0.64M GaCl$_3$, 1.43M NaF and 0.5M NaCl dissolved water. pH of the solution is approximately 1.7. The gallium films are electrodeposited at a plating current density of 0.8 mA/cm$^2$ for 6 minutes.

Example 7

5.3 atom % Ga electrodeposited from 0.64M GaCl$_3$, 1.43M NaF and 0.5M NaCl dissolved water. pH of the solution is approximately 1.7. The gallium films are electrodeposited at a plating current density of 0.7 mA/cm$^2$ for 15 minutes.

Example 8

26.3 atom % Ga electrodeposited from 0.64M GaCl$_3$, 1.43M NaF and 0.5M NaCl dissolved water. pH of the solution is approximately 1.7. The gallium films are electrodeposited at a plating current density of 4.7 mA/cm$^2$ for 10 minutes.

Example 9

21.4 atom % Ga electrodeposited from 0.64M GaCl$_3$, 1.43M NaF and 0.5M NaCl dissolved water. pH of the solution is approximately 1.7. The gallium films are electrodeposited at a plating current density of 3 mA/cm$^2$ for 10 minutes.

Example 10

8.8 atom % Ga electrodeposited from 0.7M GaCl$_3$, 1.43M NaF and 0.5M NaCl dissolved water. pH of the solution is approximately 1.6. The gallium films are electrodeposited at a plating current density of 1.6 mA/cm$^2$ for 4 minutes.

Example 11

7.2 atom % Ga electrodeposited from 0.05M Ga(NO$_3$)$_3$ dissolved in choline chloride ionic liquid. The gallium films are electrodeposited at a plating current density of 3 mA/cm$^2$ for 3 minutes.

Example 12

10.5 atom % Ga electrodeposited from 0.05M Ga(NO$_3$)$_3$ dissolved in choline chloride ionic liquid. The gallium films are electrodeposited at a plating current density of 3 mA/cm$^2$ for 4 minutes.

The Examples discussed above are provided for purposes of illustration and are not intended to be limiting. Still other embodiments and modifications are also contemplated. While a number of exemplary aspects and embodiments have been discussed above, those of skill in the art will recognize certain modifications, permutations, additions and sub combinations thereof. It is therefore intended that the following appended claims and claims hereafter introduced are interpreted to include all such modifications, permutations, additions and sub-combinations as are within their true spirit and scope.

I claim:

1. An electroplating solution comprising:
   a gallium salt;
   an ionic compound; and
   a solvent, wherein:
   the ionic compound is choline chloride (C$_5$H$_{14}$ClNO), and
   the solvent is ethylene glycol mixed with the ionic compound.

2. The electroplating solution of claim 1, wherein the gallium salt is selected from the group consisting of gallium chloride, gallium nitrate, gallium sulfate, gallium acetate, gallium fluoride, gallium bromide, and gallium iodide.

3. The electroplating solution of claim 1, wherein the pH of the solution is between 1 and 3.

4. A method comprising:
   electrodepositing a gallium layer from an electroplating solution, wherein:
   the electroplating solution comprises a gallium salt, an ionic compound, and a solvent,
   the ionic compound is choline chloride (C$_5$H$_{14}$ClNO), and
   the solvent is ethylene glycol mixed with the ionic compound.

5. The method of claim 4, wherein the gallium salt is selected from the group consisting of gallium chloride, gallium nitrate, gallium sulfate, gallium acetate, gallium fluoride, gallium bromide, and gallium iodide.

6. The method of claim 4, further comprising electrodepositing a copper layer on a substrate and electrodepositing an indium layer on the copper layer, prior to the electrodepositing of the gallium layer on the indium layer.

7. The method of claim 6, further comprising annealing the copper layer, the indium layer, and the gallium layer.

8. The method of claim 7, wherein the annealing is conducted at a temperature between about 100° C. and about 600° C.

9. The method of claim 7, wherein the annealing is conducted for a time period between about 10 minutes and about 120 minutes.

10. The method of claim 6, wherein the substrate comprises at least one of glass, molybdenum, silicon, silicon dioxide, aluminum oxide, sapphire, germanium, gallium arsenide, an alloy of silicon and germanium, or indium phosphide.

11. The method of claim 6, wherein the substrate is glass coated with a molybdenum film.

12. The method of claim 6, wherein the atomic percent of gallium in a thin film comprising the copper layer, the indium layer, and the gallium layer is between 0.5% and 30%.

13. The method of claim 6, wherein the thickness of a thin film comprising the copper layer, the indium layer, and the gallium layer is between about 0.5 microns and about 6 microns.

14. The method of claim 4, wherein the gallium layer is electrodeposited at a plating current density between 0.1 mA/cm$^2$ and 5 mA/cm$^2$.

15. The method of claim 4, wherein the gallium layer is electrodeposited at a plating current density between 0.5 mA/cm$^2$ and 10 mA/cm$^2$.

16. The method of claim 4, wherein the pH of the solution is between 1 and 3.

* * * * *